US008461021B2

(12) United States Patent
Yaung et al.

(10) Patent No.: US 8,461,021 B2
(45) Date of Patent: Jun. 11, 2013

(54) MULTIPLE SEAL RING STRUCTURE

(71) Applicant: Taiwan Semiconductor Manufacturing Company, Ltd., Hsin-Chu (TW)

(72) Inventors: Dun-Nian Yaung, Taipei (TW); Jen-Cheng Liu, Hsin-Chu (TW); Jen-Shyan Lin, Tainan (TW); Wen-De Wang, Minsyong Township, Chiayi County (TW); Shu-Ting Tsai, Kaoshiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/725,123

(22) Filed: Dec. 21, 2012

(65) Prior Publication Data
US 2013/0109153 A1 May 2, 2013

Related U.S. Application Data

(62) Division of application No. 12/938,272, filed on Nov. 2, 2010, now Pat. No. 8,338,917.

(60) Provisional application No. 61/373,679, filed on Aug. 13, 2010.

(51) Int. Cl.
 *H01L 23/02* (2006.01)
 *H01L 21/71* (2006.01)

(52) U.S. Cl.
 USPC ............ 438/462; 257/620; 257/E21.536; 257/E23.194; 438/460; 438/461; 438/463

(58) Field of Classification Search
 USPC .......... 257/620, E21.536, E23.194; 438/460, 438/461, 462, 463
 See application file for complete search history.

(56) References Cited

U.S. PATENT DOCUMENTS

| 6,365,958 B1 | 4/2002 | Ibnabdeljalil et al. |
| 6,998,712 B2 | 2/2006 | Okada et al. |
| 7,605,448 B2 | 10/2009 | Furusawa et al. |
| 2005/0087878 A1 | 4/2005 | Uesugi et al. |
| 2006/0163720 A1 | 7/2006 | Hirata |

*Primary Examiner* — Peniel M Gumedzoe
(74) *Attorney, Agent, or Firm* — Haynes and Boone, LLP

(57) ABSTRACT

The present disclosure provides a method of fabricating a semiconductor device, the method including providing a substrate having a seal ring region and a circuit region, forming a first seal ring structure over the seal ring region, forming a second seal ring structure over the seal ring region and adjacent to the first seal ring structure, and forming a first passivation layer disposed over the first and second seal ring structures. A semiconductor device fabricated by such a method is also provided.

14 Claims, 6 Drawing Sheets

MULTIPLE SEAL RING STRUCTURE

PRIORITY DATA

This application is a divisional application of U.S. patent application Ser. No. 12/938,272, filed Nov. 2, 2010, now U.S. Pat. No. 8,338,917 issued Dec. 25, 2012, which claims priority to U.S. Patent Application No. 61/373,679, filed Aug. 13, 2010, which are each incorporated herein by reference in their entirety.

BACKGROUND

The design and packaging of semiconductor integrated circuits (ICs), there are several areas of concern. Moisture needs to be prevented from entering the circuits because: (1) moisture can be trapped in oxides and increase the dielectric constant thereof; (2) moisture can create trapped charge centers in gate oxides causing threshold voltage shifts in complementary metal-oxide-semiconductor (CMOS) transistors; (3) moisture can create interface states at the Si-gate oxide interface causing degradation in the transistor lifetime through increased hot-electron susceptibility; (4) moisture can cause corrosion of the metal interconnect, reducing the reliability of the IC; and (5) when trapped in Si-oxide, moisture can reduce the oxide mechanical strength and the oxide may become more prone to cracking due to tensile stress. Ionic contaminants can also cause damage to the IC as they can diffuse rapidly in silicon oxide. For instance, ionic contaminants can cause threshold voltage instability in CMOS transistors and alter the surface potential of the Si surface in the vicinity of the ionic contaminants. Dicing processes that separate adjacent IC dies from one another may also cause potential damage to the IC.

A seal ring has been used in the industry to protect the IC from moisture degradation, ionic contamination, and dicing processes, but improvement has been desirable. In particular, a dicing process using a mechanical die saw may cause peeling of layers from the die saw cutting forces. Backside illuminated devices having inter-metal or interlayer dielectric films with low dielectric constants (low-k) are especially prone to die saw peeling. Accordingly, improved methods of semiconductor device fabrication and devices fabricated by such methods are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
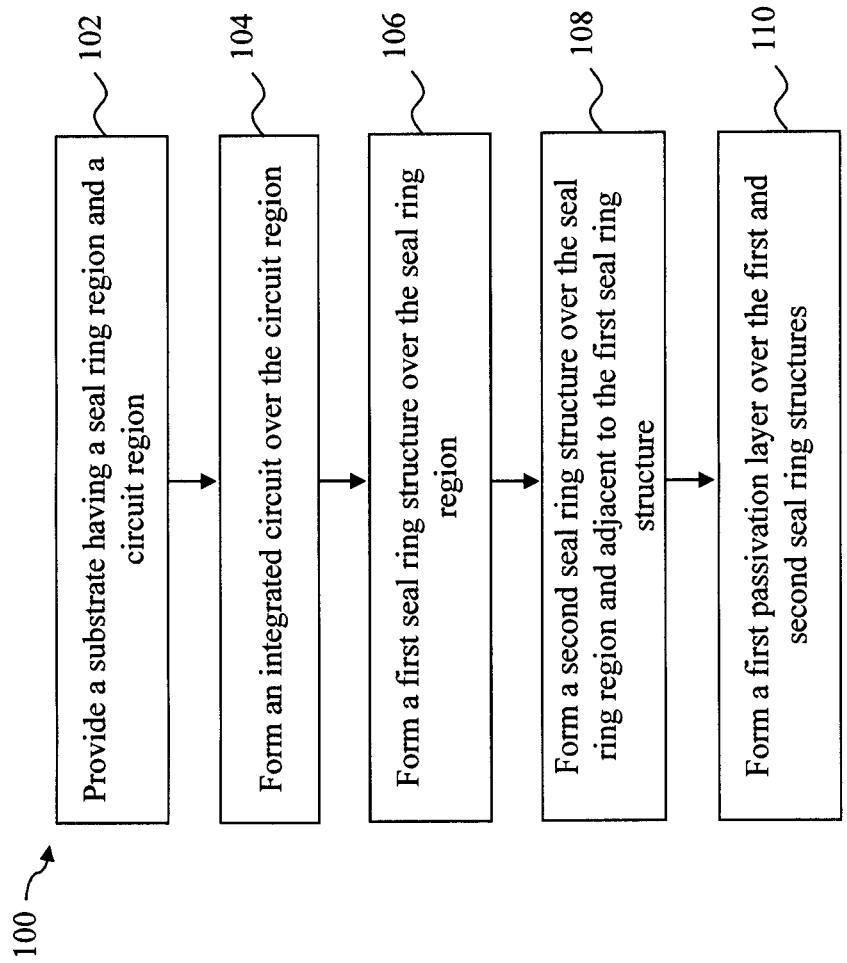
FIG. 1 is a flowchart illustrating a method for fabricating a semiconductor device with a multiple seal ring structure for preventing die saw peeling according to various aspects of the present disclosure.
Figure 2:
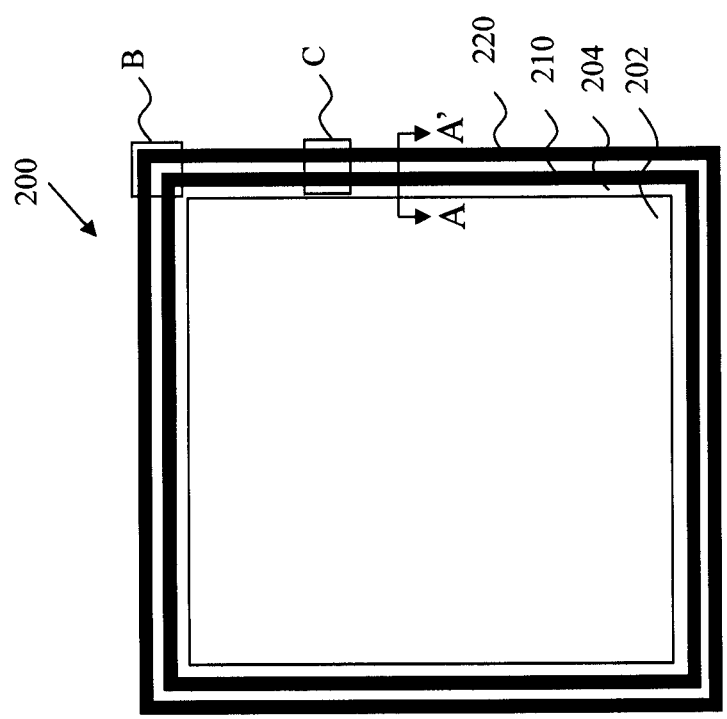
FIG. 2 is a top plan view of an integrated circuit (IC) die with a seal ring structure according to various aspects of the present disclosure.
Figure 3A:
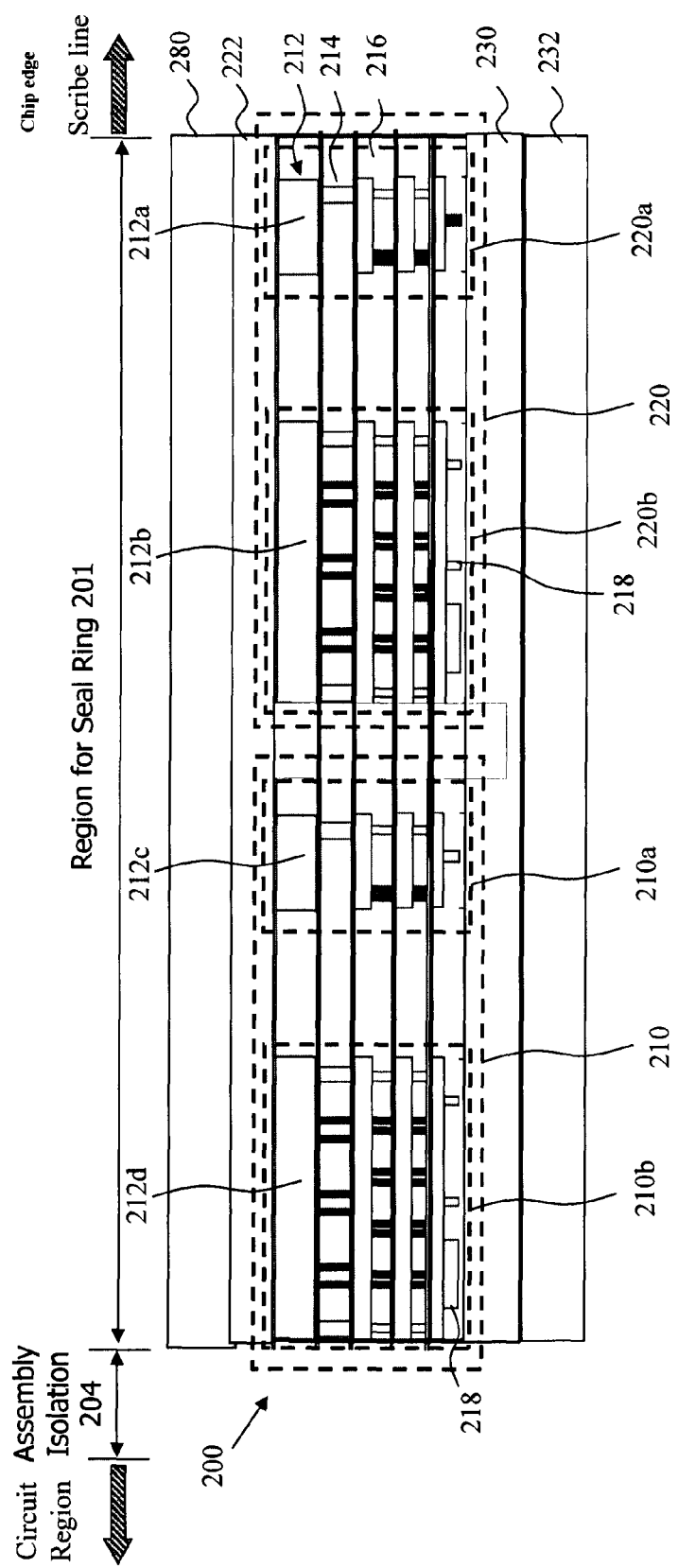
FIG. 3A is a cross-sectional view along line A-A' in FIG. 2 according to various aspects of the present disclosure.
Figure 3B:
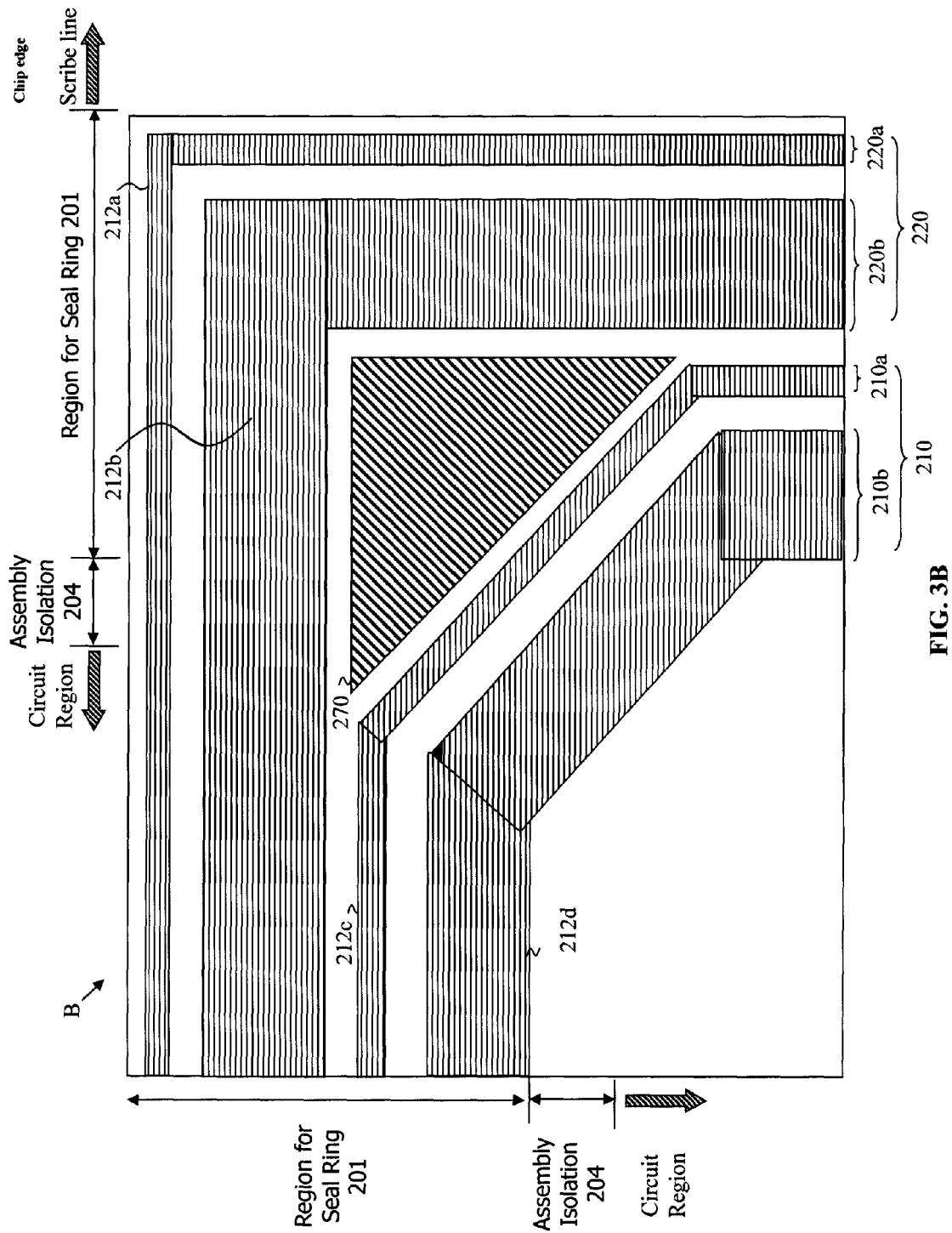
FIGS. 3B and 3C are close-up top views of sections B and C in FIG. 2 showing embodiments of the seal ring structure according to various aspects of the present disclosure.
Figure 3C:
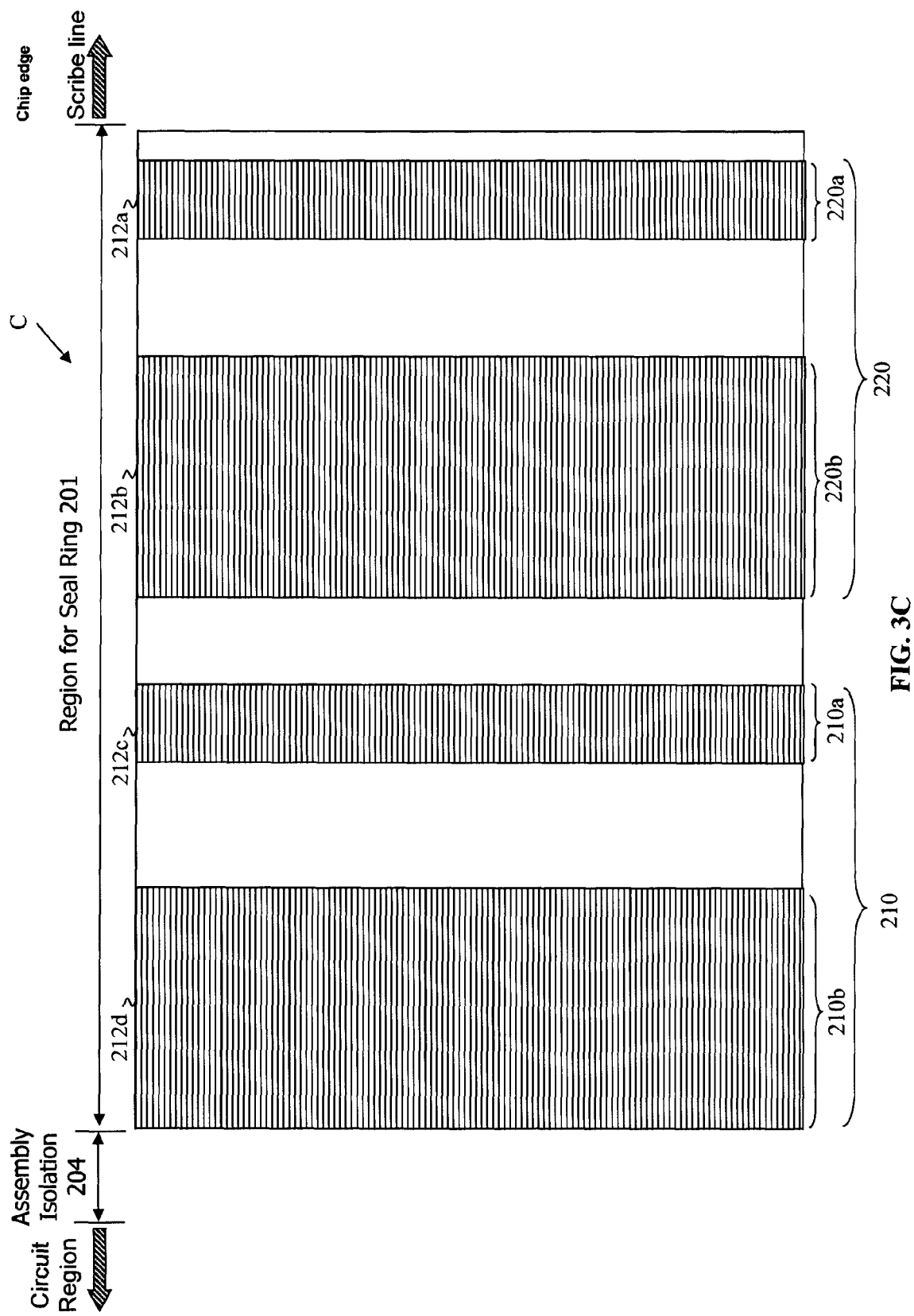
Figure 4:
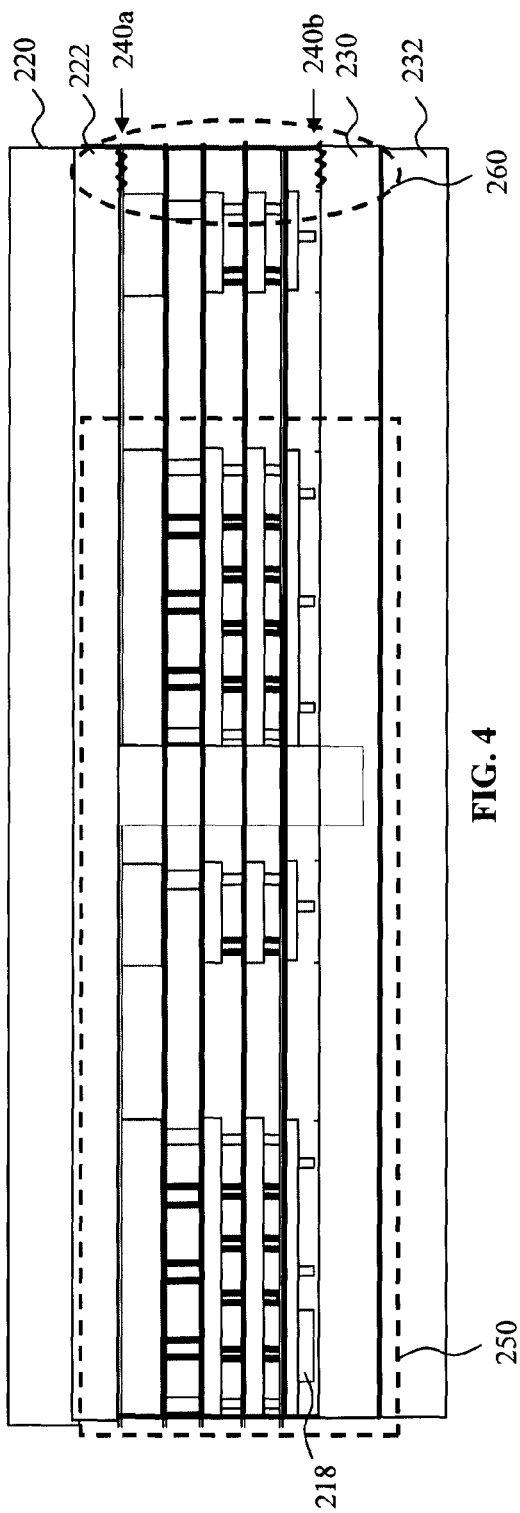
FIG. 4 is a cross-sectional view of an embodiment of the device showing blocked die saw effects according to various aspects of the present disclosure.
Figure 5:
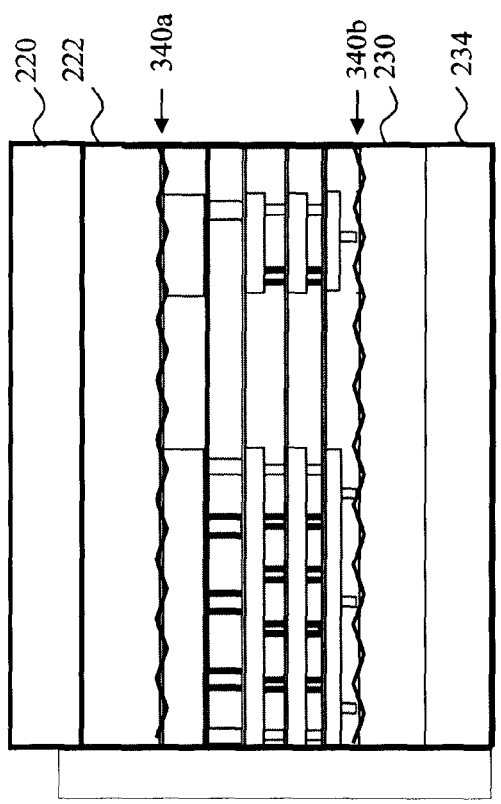
FIG. 5 is a cross-sectional view of a previous seal ring structure showing die saw effects on the previous semiconductor device.

Referring to the figures, FIG. 1 illustrates a flowchart of a method 100 for fabricating a semiconductor device with a multiple seal ring structure for preventing or blocking die saw peeling effects on the device according to various aspects of the present disclosure. FIG. 2 is a top plan view of a semiconductor device including an integrated circuit (IC) die and a seal ring structure around the IC die according to various aspects of the present disclosure. FIG. 3A is a cross-sectional view of an embodiment of the multiple seal ring structure according to various aspects of the present disclosure, and FIGS. 3B and 3C are close-up top views of embodiments of the seal ring structure (without overlying passivation layer and carrier wafer) according to various aspects of the present disclosure. FIG. 4 is a cross-sectional view of an embodiment of the seal ring structure of FIG. 3 showing blocked die saw effects on the semiconductor device according to various aspects of the present disclosure. In contrast, FIG. 5 illustrates a cross-sectional view of a previous seal ring structure showing die saw peeling effects on the device.

It is noted that similar features may be similarly numbered for the sake of simplicity and clarity. It is further noted that part of the semiconductor device 200 may be fabricated with a CMOS process flow. Accordingly, it is understood that additional processes may be provided before, during, and after the method 100 of FIG. 1, and that some other processes may only be briefly described herein. The semiconductor device 200 may be fabricated to include a backside illuminated (BSI) device having an interlayer dielectric (ILD) such as a low-k inter-metal dielectric (IMD).

Referring now to FIG. 1, method 100 begins with block 102 in which a semiconductor substrate is provided having a seal ring region and a circuit region. In an embodiment, the seal ring region is formed around the circuit region, and the seal ring region is for forming a seal ring structure thereon and the circuit region is for at least forming a transistor device therein. The method 100 continues with block 104 in which an integrated circuit is formed over the circuit region, and with block 106 in which a first seal ring structure is formed over the seal ring region. The method 100 continues with block 108 in which a second seal ring structure is formed over the seal ring region and adjacent to the first seal ring structure, and with block 110 in which a first passivation layer is formed over the first and second seal ring structures. Other layers, lines, vias, and structures may also be provided before, during, or after the steps of method 100, such as additional passivation layers above and below the structure formed by method 100, and a carrier wafer bonded to the first passivation layer. Advantageously, because the multiple seal ring structures are adjacently formed in the seal ring region, die saw peeling effects are blocked from affecting an interior portion of the seal ring structures and therefore the interior integrated circuit is also protected. In other words, a double seal ring, in one example, can prevent peeling effects from penetrating into the internal seal ring, as will be further explained herein.

Referring now to FIG. 2, a top plan view of a device 200 is illustrated including an integrated circuit (IC) die 202, a plurality of concentric seal ring structures 210 and 220 around the IC die 202, and an assembly isolation region 204 therebetween according to various aspects of the present disclosure. A cross-sectional view of the seal ring region along line A-A' is illustrated in FIG. 3A, and close-up top views of sections B and C showing embodiments of the plurality of seal ring structures are illustrated in FIGS. 3B and 3C, respectively.

Referring now to FIG. 3A in conjunction with FIG. 2, a cross-sectional view of an embodiment of semiconductor device 200 at a stage of fabrication according to the method 100 of FIG. 1 is illustrated. The semiconductor device 200 may include a semiconductor substrate 230 such as a silicon substrate (e.g., a p-doped substrate) having a seal ring region 201 and assembly isolation region 204 surrounding IC die 202 in a circuit region. In an embodiment, the seal ring region 201 is formed around the circuit region, and the seal ring region is for forming a multiple seal ring structure thereon and the circuit region is for forming at least a transistor device therein. The substrate 230 may alternatively include silicon germanium, gallium arsenic, or other suitable semiconductor materials. The substrate 230 may further include doped regions, such as a P-well, an N-well, and/or a doped active region such as a P+ doped active region. In one aspect, the doped active regions may be disposed within other regions. The substrate 230 may further include other features such as a buried layer, and/or an epitaxy layer. Furthermore, the substrate 230 may be a semiconductor on insulator such as silicon on insulator (SOI). In other embodiments, the semiconductor substrate 230 may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The device 200 may further include isolation structures, such as shallow trench isolation (STI) features or LOCOS features formed in the substrate 230 for isolating active regions from other regions of the substrate. The active regions may be configured as an NMOS device (e.g., nFET) or as a PMOS device (e.g., pFET) in one example.

The device 200 may further include dummy gate and/or gate structures (not shown) overlying the substrate 230, which may be formed from various material layers and by various etching/patterning techniques over various regions of device 200.

The device 200 further includes contact bars 218 to electrically couple active regions to the subsequently formed seal ring structures 210 and 220. It is noted that other layers may be provided in the seal ring region to form various features over and/or under the seal ring structure such as passivation layers, nitride layers, and polyimide layers deposited by CVD, spin-on techniques, and the like. The semiconductor substrate 230 may further include underlying layers, overlying layers, devices, junctions, and other features formed during prior process steps or which may be formed during subsequent process steps.

Device 200 includes seal ring structures 210 and 220 disposed over substrate 230 in the seal ring region 201. In one embodiment, seal ring structures 210 and 220 are concentric to each other and may be formed simultaneously or alternately. Each of the seal ring structures 210 and 220 may be comprised of various stacked conductive layers 212 and via layers 214 disposed through dielectric layers 216. Seal ring structure 210 includes an exterior portion 210a and an interior portion 210b, and seal ring structure 220 includes an exterior portion 220a and an interior portion 220a. Exterior portion 220a is adjacent the chip edge and scribe line and interior portion 210b is adjacent the assembly isolation 204 and the circuit region. Exterior portion 220a includes a top metal layer 212a, interior portion 220b includes a top metal layer 212b, exterior portion 210a includes a top metal layer 212c, and interior portion 210b includes a top metal layer 212d.

A second or multiple frontside passivation layer(s) (not shown) may be disposed over the first passivation layer 222 in some embodiments. A carrier wafer 280 may then be bonded to the first passivation layer 222. A second or multiple frontside passivation layer(s) (not shown) may be disposed over the first passivation layer 222 in some embodiments. A carrier wafer 220 may then be bonded to the first passivation layer 222.

In one embodiment, substrate 230 may include an underlying second passivation layer or a first backside passivation layer as a bottom layer in the seal ring region. In one example, the second passivation layer or the first backside passivation layer may be formed by deposition of an oxygen dopant or deposition of a passivation layer by a high aspect ratio process (HARP) and/or a high density plasma (HDP) CVD process. In one example, the second passivation layer or the first backside passivation layer includes a dielectric (ILD or IMD) and is an oxide. Furthermore, in one example, the substrate 230 may be thinned by an etch prior to the formation of the second passivation layer.

A backside passivation layer 232 may be disposed over the substrate 230. In one example, backside passivation layer 232 may be comprised of silicon oxide and/or silicon nitride. The various passivation layers may undergo patterning and etch steps to form the structure profiles as desired.

It is understood that the semiconductor device 200 may undergo further processing in the circuit region to form various features such as contacts/vias, interconnect metal layers, interlayer dielectric, passivation layers, etc. to form semiconductor circuits as is known in the art. It is further understood that in some embodiments, semiconductor device 200 may only include a frontside metal pad or a backside metal pad and not both metal pads.

Referring now to FIGS. 3B and 3C, top views of sections B and C in FIG. 2 showing embodiments of the seal ring structures and device 200 are illustrated without carrier layer 220 and frontside passivation layer 222. Top view of section B illustrates a corner section of the multiple seal ring structure, and top view of section C illustrates a linear side section of the multiple seal ring structure. The top views show the metal layers 212 of the seal ring structures and thus are views without the overlying passivation layer and carrier wafer.

In the embodiment illustrated in FIG. 3B, exterior seal ring structure 220 has exterior portion 220a which has metal layer 212a and interior portion 220b which has metal layer 212b. Exterior seal ring structure 220 has linearly-shaped sections and form a right angle at the corner of the chip. Interior seal ring structure 210 has exterior portion 210a which has metal layer 212c and interior portion 210b which has metal layer 212d. The multiple seal ring structure at the corner further includes a triangularly-shaped interior seal ring structure 270 between seal ring structures 210 and 220. In one embodiment, interior seal ring structure 270 is shaped as an isosceles triangle with legs of the triangle running parallel to the legs of the exterior seal ring structure 220 and the hypotenuse of the triangle adjacent the interior seal ring structure 210. In other embodiments, other triangular shapes may be used. Besides the triangular shape, interior seal ring structure 270 may be otherwise substantially similar in structure including various stacked conductive layers and via layers disposed through dielectric layers. Interior seal ring structure 210 also has interior portion 210b which has metal layer 212d. Interior seal ring structure 210 has linearly-shaped sections that are disposed in parallel to the linear legs of exterior seal ring structure 220 and the hypotenuse of triangularly-shaped interior seal ring structure 270. Other metal layer shapes and geometries are within the scope of the present disclosure. Accordingly, the embodiment illustrated in FIG. 3B shows seal ring structures 210 and 220 which are different at least in geometric terms. In one example, the exterior seal ring structure 220 may be termed an "A-type" seal ring and interior seal ring structures 210 and 270 may be termed a "B-type" seal ring. Advantageously, such a combination of A-type and B-type seal rings provides for increased prevention of layer peeling at the corner of the chip, which has previously been more susceptible to layer peeling from mechanical dicing processes.

In the embodiment illustrated in FIG. 3C, section C illustrates a linear side of the chip and the seal ring structures 210 and 220 have metal layers which are shaped in substantially similar geometric terms. In this embodiment, seal ring structures 210 and 220 are both "A-type" seal rings and have metal layers which are linearly shaped.

Referring now to FIGS. 4 and 5, FIG. 4 is a cross-sectional view of an embodiment of the seal ring structure of FIG. 3A showing blocked die saw effects on the semiconductor device 200 according to various aspects of the present disclosure, and in contrast, FIG. 5 illustrates a cross-sectional view of a previous seal ring structure showing die saw peeling effects on the device. Die saw effects, as illustrated by jagged lines 240a and 240b, are limited to the exterior seal ring structure (as shown by oval area 260) and are blocked by the multiple interior seal ring structures from traversing to the interior structures, thereby protecting the interior seal ring structure 210 from die saw peeling effects (as shown by boxed area 250) and thereby protecting the interior circuit device from layer peeling.

In contrast, FIG. 5 illustrates die saw peeling effects as shown by the jagged lines 340a and 340b traversing to the interior portion of the seal ring structure because of the lack of multiple interior seal ring structures. In particular, FIG. 5 illustrates die saw peeling effects 340a and 340b shown along the interfaces of the passivation layers 222 and 230, but FIG. 4 illustrates die saw peeling effects 240a and 240b blocked by the multiple interior seal ring structures. In one embodiment, a diamond cutter instead of a laser may be used to cut along the scribe lines of a device having multiple seal ring structures according to aspects of the present disclosure, thereby reducing manufacturing costs.

The present disclosure provides for many different embodiments. One of the broader forms of the present disclosure involves a semiconductor device. The semiconductor device includes a substrate having a seal ring region and a circuit region, a first seal ring structure disposed over the seal ring region, a second seal ring structure disposed over the seal ring region and adjacent to the first seal ring structure, and a first passivation layer disposed over the first and second seal ring structures.

Another of the broader forms of the present disclosure involves a semiconductor device including a substrate having a seal ring region and a circuit region, and a first seal ring structure disposed over the seal ring region adjacent the circuit region, the first seal ring structure having a plurality of triangular-shaped metal layers. The device further includes a second seal ring structure disposed over the seal ring region adjacent to a scribe line and the first seal ring structure, the second seal ring structure having a plurality of linear-shaped metal layers. A first passivation layer is disposed over the first and second seal ring structures.

Yet another of the broader forms of the present disclosure involves a method of fabricating a semiconductor device. The method includes providing a substrate having a seal ring region and a circuit region, forming a first seal ring structure over the seal ring region, forming a second seal ring structure over the seal ring region and adjacent to the first seal ring structure, and forming a first passivation layer disposed over the first and second seal ring structures.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, the method comprising:
   providing a substrate having a seal ring region and a circuit region;
   forming a first seal ring structure disposed over the seal ring region;
   forming a second seal ring structure disposed over the seal ring region and adjacent to the first seal ring structure, wherein the first and second seal ring structures are physically separated and continuously formed around the circuit region and have no contact or pad structure portion;
   forming a third seal ring structure between the first and second seal ring structures at a corner section, the third seal ring structure having a triangular shape, wherein the third seal ring structure is the only ring structure present between the first and second seal ring structures at the corner section; and
   forming a first passivation layer disposed over the first, second, and third seal ring structures.

2. The method of claim 1, wherein the first and second seal ring structures are each formed to be a stack of metal layers disposed around the circuit region.

3. The method of claim 1, wherein the first and second seal ring structures are each formed to have a line-shaped metal layer.

4. The method of claim 1, wherein the second seal ring structure is formed to be concentric to the first seal ring structure.

5. The method of claim 1, wherein the first seal ring structure is formed to be adjacent the circuit region and the second seal ring structure is formed to be adjacent a scribe line.

6. The method of claim 1, wherein the first and second seal ring structures each are formed to have a plurality of linear-shaped metal layers.

7. The method of claim 1, wherein the first passivation layer is comprised of silicon oxide.

8. The method of claim 1, further comprising forming a second passivation layer disposed under the first and second seal ring structures.

9. A method of fabricating a semiconductor device, the method comprising:

providing a substrate having a seal ring region and a circuit region;

forming a first seal ring structure disposed over the seal ring region adjacent the circuit region, the first seal ring structure having a plurality of linear-shaped metal layers;

forming a second seal ring structure disposed over the seal ring region adjacent to a scribe line and the first seal ring structure, the second seal ring structure having a plurality of linear-shaped metal layers, wherein the first and second seal ring structures are physically separated and continuously formed around the circuit region and have no contact or pad structure portion;

forming a third seal ring structure disposed over the seal ring region and between the first and second seal ring structures at a corner section, the third seal ring structure having a plurality of triangular-shaped metal layers, wherein the third seal ring structure is the only ring structure present between the first and second seal ring structures at the corner section; and forming a first passivation layer disposed over the first, second, and third seal ring structures.

10. The method of claim 9, wherein the first, second, and third seal ring structures are each formed to be a stack of metal layers disposed around the circuit region.

11. The method of claim 9, wherein the second and third seal ring structures are formed to have line-shaped legs running in parallel to each other.

12. The method of claim 9, wherein the second seal ring structure is formed to be concentric to the first seal ring structure.

13. The method of claim 9, wherein the first passivation layer is comprised of silicon oxide.

14. The method of claim 9, further comprising forming a second passivation layer disposed under the first and second seal ring structures.

* * * * *